(12) United States Patent
Chen et al.

(10) Patent No.: US 6,790,744 B2
(45) Date of Patent: Sep. 14, 2004

(54) MONOLITHICALLY INTEGRATED SOLID-STATE SIGE THERMOELECTRIC ENERGY CONVERTER FOR HIGH SPEED AND LOW POWER CIRCUITS

(75) Inventors: Fen Chen, Williston, VT (US); Timothy D. Sullivan, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/459,974

(22) Filed: Jun. 12, 2003

(65) Prior Publication Data

US 2004/0000333 A1 Jan. 1, 2004

Related U.S. Application Data

(62) Division of application No. 10/064,303, filed on Jul. 1, 2002, now Pat. No. 6,639,242.

(51) Int. Cl.[7] ............................................. H01L 21/00
(52) U.S. Cl. ....................................................... 438/415
(58) Field of Search ........................................ 438/415

(56) References Cited

U.S. PATENT DOCUMENTS

| | | | |
|---|---|---|---|
| 3,635,037 A | * | 1/1972 | Hubert ........................ 62/3.2 |
| 4,054,478 A | | 10/1977 | Linnon |
| 4,935,864 A | | 6/1990 | Schmidt et al. |
| 5,522,216 A | | 6/1996 | Park et al. |
| 5,550,387 A | | 8/1996 | Elsner et al. |
| 5,608,568 A | | 3/1997 | Blodgett et al. |
| 5,747,728 A | | 5/1998 | Fleurial et al. |
| 5,900,071 A | * | 5/1999 | Harman ................... 136/236.1 |
| 5,956,569 A | | 9/1999 | Shiu et al. |
| 6,060,656 A | | 5/2000 | Dresselhaus et al. |
| 6,100,463 A | | 8/2000 | Ladd et al. |
| 6,105,381 A | | 8/2000 | Ghoshal |
| 6,222,113 B1 | | 4/2001 | Ghoshal |
| 6,230,497 B1 | | 5/2001 | Morris et al. |
| 6,384,312 B1 | | 5/2002 | Ghoshal et al. |
| 6,403,874 B1 | | 6/2002 | Shakouri et al. |
| 2002/0033188 A1 | | 3/2002 | Shakouri et al. |
| 2002/0063327 A1 | | 5/2002 | Chu et al. |
| 2002/0092557 A1 | | 7/2002 | Ghoshal |
| 2002/0113289 A1 | | 8/2002 | Cordes et al. |

* cited by examiner

*Primary Examiner*—W. David Coleman
(74) *Attorney, Agent, or Firm*—McGinn & Gibb, PLLC; Mark F. Chadurjian, Esq.

(57) ABSTRACT

A method and structure for a semiconductor structure that includes a substrate having at least one integrated circuit heat generating structure is disclosed. The invention has at least one integrated circuit cooling device on the substrate adjacent the heat generating structure. The cooling device is adapted to remove heat from the heat generating structure. The cooling device includes a cold region and a hot region. The cold region is positioned adjacent the heat generating structure. The cooling device has one of a silicon germanium super lattice structure. The cooling device also has a plurality of cooling devices that surround the heat generating structure. The cooling device includes a thermoelectric cooler.

6 Claims, 5 Drawing Sheets

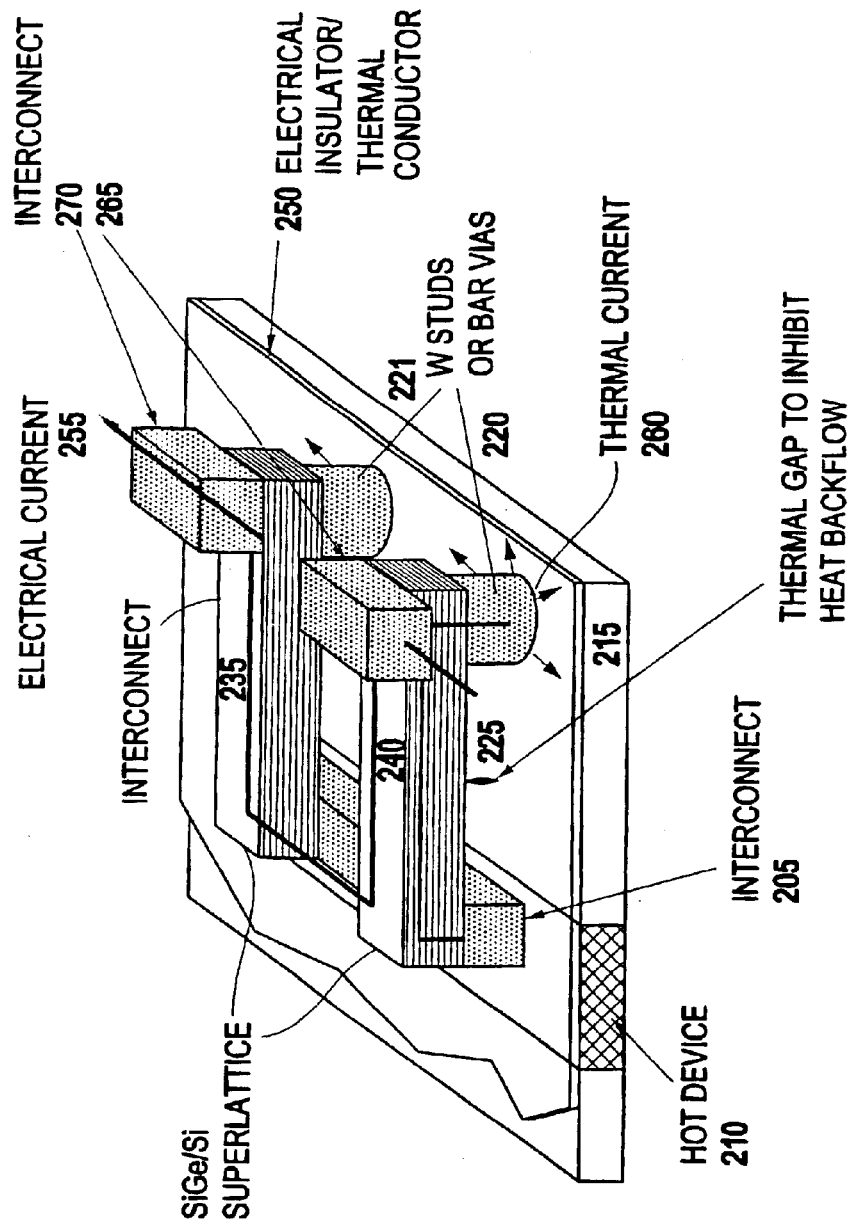
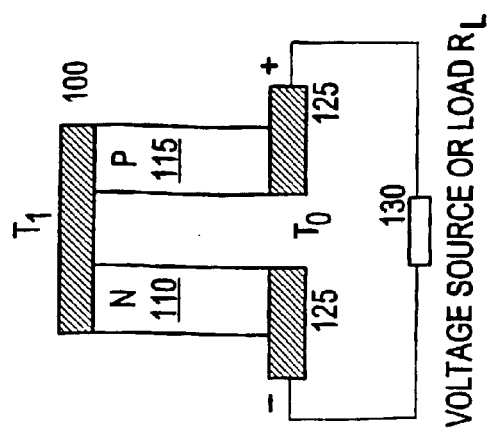
FIG.1
FIG.2

MONOLITHICALLY INTEGRATED SOLID-STATE SIGE THERMOELECTRIC ENERGY CONVERTER FOR HIGH SPEED AND LOW POWER CIRCUITS

CROSS-REFERENCE TO RELATED APPLICATIONS

This application is a division of U.S. application Ser. No. 10/064,303 filed Jul. 1, 2002 now U.S. Pat. No. 6,639,242.

BACKGROUND OF THE INVENTION

Field of the Invention

The present invention generally relates to silicon semiconductor chips and more particularly to an improved semiconductor chip that includes thermoelectric energy converters.

Heat generation and heat transport in deep sub-micron very large scale integration (VLSI) and radio frequency (RF) circuits is of increasing concern under normal device operation. In RF circuits, significant heat generation by the power amplifiers in the transmitter circuitry can adversely affect circuit performance (noise, speed, and reliability). In addition, a significant heat source will induce a significant thermal gradient across the chip. Use of the most advanced technologies such as (silicon-on-insulator) SOI and low-dielectric constant (low-K) inter-level dielectric (ILD) materials further aggravates the thermal management problem for deep sub-micron VLSI and RF circuits. For silicon-on-insulator (SOI) technology, the thermal conductivity of the insulator layer is more than two orders of magnitude lower than the usual Si substrate (0.66 W/m-K vs. 148 W/m-K). Heat generated above the oxide layer is less able to dissipate into the substrate, resulting in self heating. Thus high currents flowing in the channel lead to an increase in the channel temperature, which can degrade device performance and reliability. Use of low-K dielectrics for advanced interconnect passivation has a similar effect. Low-k dielectric materials have relatively lower thermal conductivities than conventional glass materials such as Silane oxide (0.19 vs 1.07 W/m-K, respectively). Heat dissipation from metal interconnects carrying high current is therefore much less effective when a low-K material is used for metal passivation. The resultant increase in wire temperature can induce electromgration and stress voiding problems.

Ordinarily, a device on a silicon chip is only one of several which generate heat. Such heat, together with that from all other devices on the chip, acts to raise the average temperature of the substrate. If only a single device, or a small fraction of those on the chip, operates at a temperate higher than the ambient average, it can be cooled by removing heat locally and depositing it into the ambient reservoir far from the device being cooled. This will raise the ambient temperature of the reservoir somewhat, but because of the size of the reservoir, the magnitude will be relatively small. However, if all devices are cooled, the average temperature of the reservoir will rise to the point where the reservoir will supply heat to the device being cooled as fast as the cooling devices can remove it. Therefore, there is a need to provide thermal isolation of the device being cooled from the substrate, such that the temperature of the cooled device is below that of the average substrate temperature.

In order to intelligently manage on-chip thermal generation, there is a need for monolithically integrated solid-state energy converters that provide localized cooling capabilities and on-chip power generation for future high-speed, low-power, and high performance circuits. The invention described below provides such a structure and method for making such a structure.

BRIEF SUMMARY OF THE INVENTION

In view of the foregoing problems, disadvantages, and drawbacks, the present invention has been devised, and it is an object of the present invention to provide a structure and method for improved semiconductor chip devices that include thermoelectric energy converters, and thermoelectric coolers in particular.

In order to accomplish the object(s) suggested above, there is provided, according to one aspect of the invention, a semiconductor structure that includes a substrate having at least one integrated circuit heat generating structure. The invention has at least one integrated circuit cooling device on the substrate surrounding the heat generating structure. The cooling device is adapted to remove heat from the area around the heat generating structure. The cooling device includes a cold region and a hot region. The cold region is positioned adjacent the heat generating structure.

The invention also presents a method of creating an integrated thermoelectric cooling device. The method forms a strained silicon layer over a substrate, patterns the strained silicon layer to form a mesa island, forms a superlattice structure on the substrate adjacent the mesa island, alternately dopes N-type and P-type regions within the superlattice structure, removes undoped regions of the superlattice structure, and forms a patterned metal conductor to connect N-type and P-type doped regions of the super lattice structure. The invention forms a strained silicon layer by epitaxially growing the strained silicon layer. The doping process can comprise a series of masking and doping processes that individually create the N-type and P-type regions within the superlattice structure.

BRIEF DESCRIPTION OF THE SEVERAL VIEWS OF THE DRAWINGS

The foregoing and other objects, aspects and advantages will be better understood from the following detailed description of a preferred embodiment(s) of the invention with reference to the drawings, in which:

FIG. 1 is a schematic diagram of a thermoelectric energy converter couple;

FIG. 2 is a three-dimensional perspective view of a thermoelectric energy converter used as a microcooler for an integrated device;

DETAILED DESCRIPTION OF THE INVENTION

Figure 3:
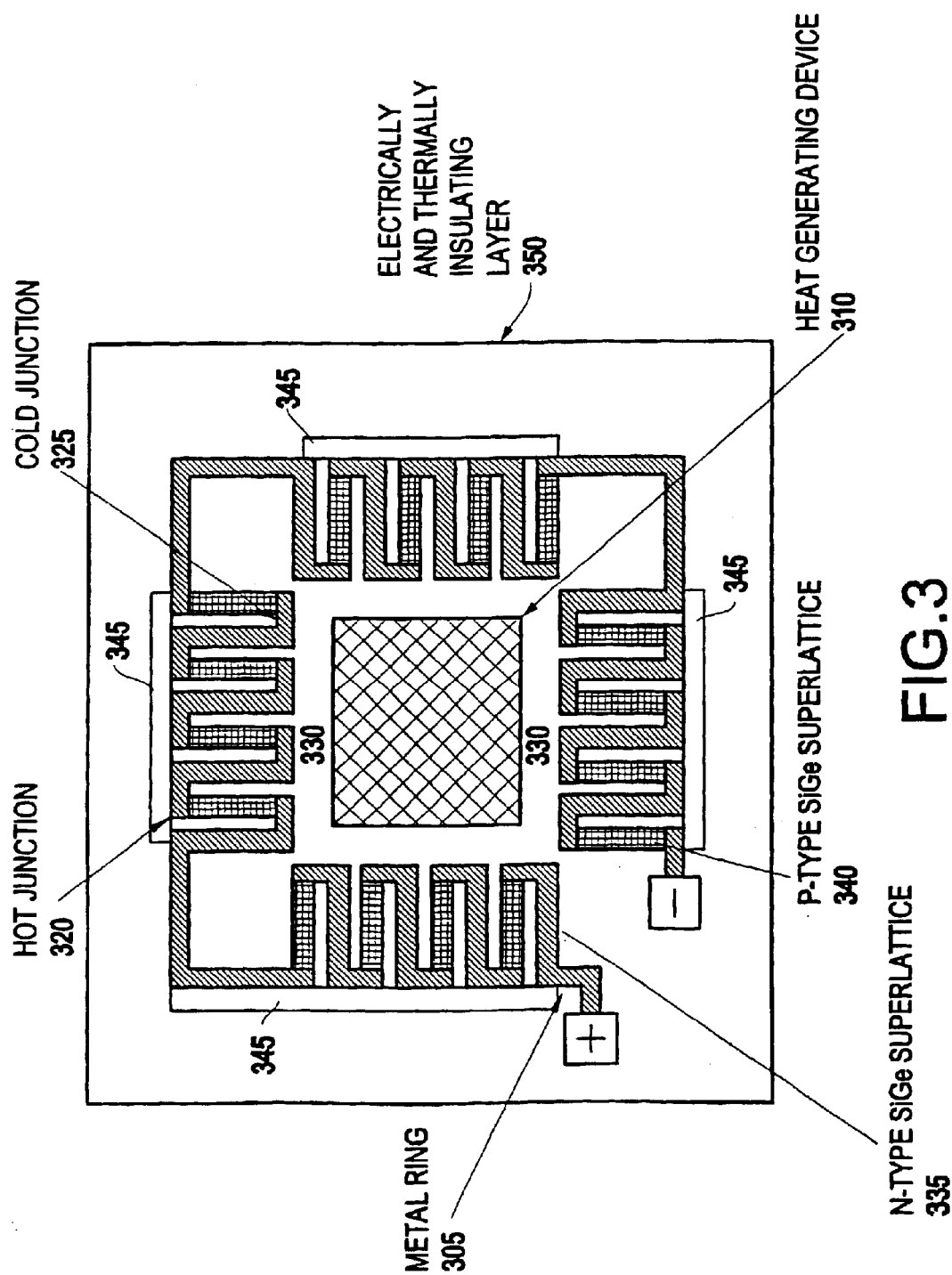
FIG. 3 is a schematic diagram of a top view of a device on a chip surrounded by microcooler structures.

As mentioned above, there is a need for a monolithically integrated solid-state energy converter that provides localized cooling and heating capabilities for future high-speed, low-power, and high performance circuits. The invention described below provides such a structure and method for making such a structure.

More specifically, in thermoelectric materials, thermal gradient (dT) is created when an electric current is passed through a thermoelectric junction. This provides a temperature gradient with heat being absorbed on the cold side and rejected at the hot side (heat sink). Thus, the invention provides a refrigeration capability using thermoelectric materials.

Cooling electronics on the chip dramatically increases speed, improves reliability, and reduces unwanted noise, especially for optoelectronics applications, laser diodes, RF amplifiers, etc. Low-temperature environments also enable the usage of superconductor material for future back-end-of-line (BEOL) interconnection with zero resistor-capacitor (RC) delay.

The cooling device can comprise a silicon germanium superlattice structure, a Bi2Te3 structure, a SiGe structure, or other suitable thermoelectric material. The basic cooling device comprises a junction between a thermoelectric material and a metal. When electrical current is passed through the junction from the thermoelectric material and the metal, heat is either absorbed or given off by electrons crossing the junction.

Semiconducting thermoelectric materials can be doped with suitable alloying elements to produce either N-type or P-type semiconductors of the same compound. If a junction of N-type thermoelectric material with a given metal absorbs heat when current flows from the metal into the N-type material, then a junction using the P-type material will give off heat when the current flows in the same direction. The invention forms a pair of N-type and P-type thermoelectric members so that they are physically parallel to each other, but connected electrically in series at one end. When current is passed through the pair, the ends connected electrically will have the same thermal polarity (hot or cold) because current will flow into the N-type (for example) from the metal, but into the metal out of the P-type material. This arrangement is called a couple. Several couples are connected electrically in series (to form a single current path) in order to operate in parallel thermally. The cooling device in this invention can have a plurality of alternating N-type and P-type cooling devices that surround the heat generating device.

Since metal is generally a good thermal conductor, the invention connects the metal body to the appropriate thermal reservoir and uses the metal connector both as the thermoelectric junction and the series electrical connection in the couple. The cold end of the couple is connected to the region to be cooled, and the hot end to a region which would absorb the heat The invention includes a silicon germanium superlattice thermoelectric cooling couple that is connected to a thermal conductor at both the hot and cold end. The invention also has an N-type super lattice structure connected to the thermal conductor; an electrical conductor connected to the N-type superlattice structure; and a P-type super lattice structure connected to the electrical conductor and to the thermal conductor. The invention has conductive studs on the thermal conductor. The conductive studs support the N-type super lattice structure and the P-type superlattice structure and form a gas or vacuum gap between the substrate and the N-type superlattice structure and the P-type superlattice structure. The thermal conductor is formed over a silicon-on-insulator (SOI) structure. The purpose of the gap is to prevent the heat being carried away from the device by the cooler from being deposited back into the substrate too close to the device.

In addition, the SiGe superlattice thermoelectric device also comprises a small-scale on-chip power generator. An imposed thermal gradient generated by the heat generating structure will result in a voltage difference or current flowing in the SiGe thermoelectric device. Due to such a device configuration, the thermal gradient is maximized for the SiGe thermoelectric device to achieve the best power efficiency. This on-chip power generation is used as waste heat recovery to effectively reduce chip power consumption.

SiGe alloys are preferable materials for thermoelectric power generation. The efficiency with which heat is converted to electric energy for bulk SiGe can be as high as 23.3%. In keeping with the principle that low-dimensionality (2D, 1D) can be used to enhance the thermoelectric performance of good 3D thermoelectric material, the inventive Si-SiGe multi-quantum well structure (which is 2D) produces higher efficiency. On the other hand, a Si-SiGeC superlattice microcooler is also useful. Furthermore, Si-SiGe superlattices are easily monolithically integrated with Si-based devices to achieve compact and efficient localized cooling.

A thermoelectric figure of merit (ZT) can be calculated according to the following function $(ZT)=\alpha 2\sigma T/\lambda$, where $\alpha$ is the Seebeck coefficient (described below), $\lambda$ is the electrical conductivity, the total thermal conductivity (where $\lambda=\lambda L+\lambda E$; the lattice and electronic contributions, respectively), and T is the absolute temperature in Kelvin. The Seebeck coefficient, or thermal power, is related to the Peltier effect by $\pi=\alpha T=QP/I$, where $\pi$ is the Peltier coefficient, QP is the rate of heating or cooling, and I is the electrical current. The efficiency $\eta$ and coefficient of performance (COP) of a thermoelectric device are both directly related to the figure of merit of the thermoelectric materials. Both $\eta$ and COP are proportional to $(1+ZT)^{1/2}$.

Material systems that exhibit complex crystal structures and heavy atoms to facilitate low thermal conductivity, and that are easy to dope (to tune the electronic properties) are of primary interest as thermoelectric materials. The thermoelectric device performance increases with a decrease in thermal conductivity. Thin films and nanostructures (low-dimensionality 2D, 1D, 0D) can be used to reduce the thermal conductivity via acoustical phonon confinement and interface scattering.

A SiGe alloy is a preferred thermoelectric material because it has a much lower thermal conductivity than the parent pure crystals, while the carrier mobility is only slightly reduced due to alloy scattering. Heterostructure SiGe/Si thermionic, superlattice coolers, as well as superlattice structures are preferred because they improve the cooler performance by reducing the thermal conductivity between the hot and the cold junctions, and by selective emission of hot carriers above the barrier layers in the thermionic emission process.

FIG. 1 shows an example of a thermoelectric energy converter, which can be used either as a thermoelectric cooler or power generator. Items 100, 120, and 125 represent contact metals, which form the thermoelectric junctions as well as provide an electrical conductor through which electric current can pass, item 110 represents an N-type structure, and 115 represents a P-type structure. When this couple is used as a cooler, item 130 represent a voltage source (Peltier effect); when this couple is used as an energy converter, item 130 represents a laid resistance RL.

When electrons flow from the metal 120 into the N-type column 110 of thermoelectric material, heat is absorbed by electrons and is carried up the column. The heat is given up as the electrons flow from the N-type column 110 into metal 100. Simultaneously, electrons flowing from metal 100 into P-type material 115 cause an equal current of holes to flow in the opposite direction. The holes absorb heat at the interface and carry the heat to the interface between P-type material 115 and metal 100, where it is released as the holes recombine with electrons entering from metal 100. Thus, while electrical current flows continuously from metal 120 through the thermoelectric couple to metal 125, heat flows from metals 100 through the N-type and P-type materials to metal 120 and 125, where it is absorbed by a heat sink. It is important to note here that the heat flow is accomplished by the current carrying species, and that the lower the thermal conductivity of the N-type and P-type materials, the more efficient the cooling.

FIG. 2 illustrates a thermoelectric cooler adapted for integration with a Si device. In this figure, the thermoelectric materials are chosen to be N-type 240 and P-type 235 superlattice structures as previously described, and are analogous in function to columns 110 and 115 shown in FIG. 1. Likewise, interconnect 205 and interconnect studs 220 and 221 are analogous to metal 100 and metals 120 and 125, respectively, in FIG. 1, and enable electrical current 255 to flow through the thermoelectric couple. The superlattice structures are formed such that the planes of the layers are parallel to the plane of the underlying substrate.

Although not emphasized in FIG. 2, the length of the superlattice structures is generally intended to be much greater than the width, such that metal studs 220 are well separated from interconnect 205. This further inhibits heat from flowing back down superlattice structures 240 and 235 (due to the small cross section) and separates the location where heat is deposited by interconnect 205 from the hot device 210.

The entire cooler couple is electrically isolated from the substrate 215 by a thin layer of electrical insulator 250. The hot device 210 is thermally connected to the cold side of the cooler couple 235, 240 (through the thin dielectric 250) by the interconnects 205. At the hot end of the cooler couple 235, 240, the couple is connected thermally to the substrate 215 by metallic studs 220 and 221, and the thin dielectric layer 250. Finally, electrically insulating material which would usually be present under superlattice structures 235 and 240 has been locally removed to create a gap 225 which prevents thermal conduction between the superlattice structures 235, 240 and the substrate 215. In one embodiment, interconnect 205, and studs 220 and 221 can comprise tungsten or, as would be known by one ordinarily skilled in the art in view of this disclosure, the studs 220, 221 could comprise polysilicon, or any other suitable metal or combination of metals.

The arrow path 255 represents the flow of current through the first super lattice structure 240 and then through the super lattice structure 235. Interconnects 265, 270 provide for current flow from and to the super lattice structures 235, 240. The arrow 260 illustrates the flow of thermal currents from the hot device 210, through the super lattice structures 235, 240, through the interconnects 220, 221, and on to a heat dissipating structure.

FIG. 3 shows a top view of a cooling structure surrounding a heat generating device. More specifically, a heat generating device 310 (e.g., semiconductor device) resides in the center of the structure and various thermoelements 335, 340 surround the hot device 310. For example, the thermoelements may comprise the alternating P-type and N-type Peltier SiGe superlattice thermoelements illustrated in FIG. 2. These elements have a hot junction region 320 and a cold junction 325. The cold junction 325 creates a cooled area 330 surrounding the hot device 310. In addition, while a single device 310 is shown within the cooled region 330 of the substrate, multiple devices could be included within the cooled region. Therefore, item 310 shown in FIG. 3 is intended to represent a single device, as well as multiple devices.

A metallization ring 305 supplies a voltage/current to all of the thermoelements 335, 340. Item 350 represents an electrically insulating layer (which could be the same as item 210 in FIG. 2, or something different) and the substrate (silicon over insulator (SOI), etc.) on which the cooling structure is formed.

In another embodiment, the invention includes a multi-stage thermoelectric cooler to enhance the cooling performance. Such a multistage junction configuration connects the hot ends of one stage of thermal couples to the cold ends of another stage. Therefore, the hot ends of the first thermal couples and cold ends of the second thermal couples are connected in series. A maximum temperature difference (or cooling performance) is achieved by using multistage thermoelectric cooler, that can include more that two stages.

As mentioned above, a device on a silicon chip is only one of several which generate heat. Such heat, together with that from all other devices on the chip, acts to raise the average temperature of the substrate. If only a single device, or a small fraction of those on the chip, operates at a temperate higher than the ambient average, it can be cooled by removing heat locally and depositing it into the ambient reservoir far from the device being cooled. This will raise the ambient temperature of the reservoir somewhat, but because of the size of the reservoir, the magnitude will be relatively small. However, if all devices are cooled, the average temperature of the reservoir will rise to the point where the reservoir will supply heat to the device being cooled as fast as the cooling devices can remove it. As shown in FIG. 3, through the invention's cooling operation, the device 310 will exist in a cool region 330 having a temperature lower than the surrounding substrate. Indeed, with the invention's operation, the device 310 may even be allowed to operate below the ambient temperature of the surrounding atmosphere. By reducing the operating temperature of the device 310, the invention allows the device to operate more efficiently, with a longer life expectancy, and with less chance of revealing potential heat-related defects.

The insulating layer 250, 350 could also be made thermally insulating by forming a thin amorphous SiC layer on oxide (SOI base) by selective carbon ion implantation into the top Si layer, which creates an amorphous SiC film that has a very low thermal conductivity and reduces the thermal bypass of the Si layer. This would create an amorphous SiC film that has a very low thermal conductivity and reduce the thermal bypass of the insulating layer 250, 350.

As voltage/current is passed through the metallization 305, the thermoelements 335, 340 transfer heat from the cold junction 325 to the hot junction 320, thereby creating a cooled area 330. The heat is dissipated through structures 345 (e.g., heat sink, etc.) adjacent and/or in contact with the hot junction 320 which allows the hot device 310 to operate at a cooler temperature.

Figure 4:
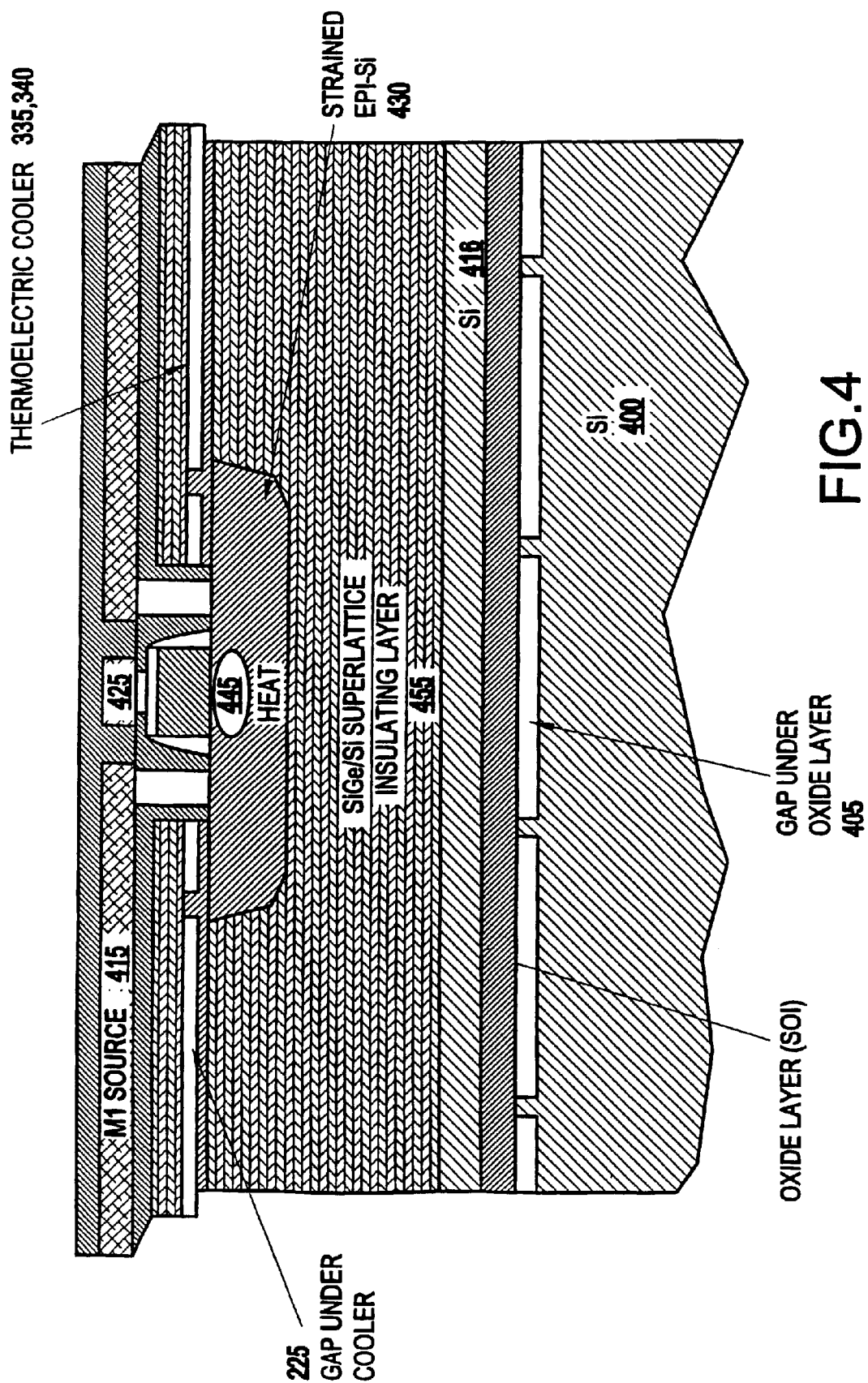
FIG. 4 is a schematic cross-sectional diagram of a device in SOI technology with microcoolers on either side, and with a solid-state SiGe/Si superlattice insulator beneath and to the sides of the device, and with gaps built in beneath the insulator layer to further inhibit the flow of thermal energy back to the device.

FIG. 4 illustrates a cross-sectional view of a portion of the structure shown in FIG. 3. The same elements are identified using the same numbers. FIG. 4 illustrate the gate 445, source 435, and drain, 440 of a transistor (which is the heat generating element in this example). Conductors 415, 420 and 425 attach to the source, drain, and gate, respectively, of the transistor. Heat is generated in an epitaxial silicon region 430 (which may be strained), which is located within an undoped silicon germanium/silicon superlattice thermally insulating layer 455. The purpose of insulating layer 455 is to prevent heat in the substrate from flowing back into the cooled Si region 430. The insulating layer 455 is formed upon a layer of silicon 416 which in turn is formed over an insulator 412, thereby creating the silicon-on-insulator (SOI) structure. The substrate 400 below the insulator layer 412 includes a number of gaps 405. The gaps further restrict the heat flow from the substrate into the device region.

As mentioned above, one embodiment uses silicon germanium thermoelectric coolers as for front side selective cooling. These are preferable because they are very useful in sub-micron, high-speed and, but low-powered devices. The maximum cooling ability is reached when the heat conduction and Joule heating exactly balance the Peltier cooling effect (Eq. 1), $$\Delta T_{max} = \frac{(ZT)T_c^2}{2\left(1 + \frac{\lambda_s d_s}{\lambda d} + \frac{\gamma A l}{4\lambda d}\right)}$$

where ZT is the figure of merit of thermoelectric material, Tc is the cold side temperature, I, Is the thermal conductivities of the thermoelectric materials and substrates; A is the length of the sides of the cooled central region, I the length of thermoelements, d and ds the thickness of the thermoelectric materials and substrate, respectively; g is a constant including emissivity and heat transfer coefficient for convection. From Equation 1, it is clear that the key for good material selection is to choose the material with large ZT. As SiGe alloy is a good thermoelectric material with fairly good ZT, and more importantly, it is compatible with Si device (no degradation of Si device by incorporation of SiGe material). Superlattice structures of SiGe alloy further enhance the ZT by 2D density of states, phonon motion confinement, interface phonon scattering, and strain enhanced carrier mobility. Specifically, quantization induced multi-subbands are represented in the following equation:

$$E_n(k_x, k_y) = \frac{\hbar^2 k_x^2}{2m_x} + \frac{\hbar^2 k_y^2}{2m_y} + \frac{\hbar^2 \pi^2 n^2}{2m_z d_w^2}$$

where n represents the number of subbands that are generated due to quantization effect. The ZT is the sum of the electrical conductivites s divided by thermal conductivity I of all subbands, as shown in the following equation:

$$ZT = \bar{a}^2 \sum_n \sigma^{(n)} T / \lambda$$

More subbands certainly will increase ZT. In addition, a spatial confinement and interface phonon scattering induced lattice thermal conductivity reduction is shown in the following equation:

$$\lambda_L = \frac{k_B}{2\pi^2 v_g}\left(\frac{k_B}{\hbar}\right)^3 T^3 \int_0^{\theta/T} \frac{\tau_C x^4 e^x}{(e^x - 1)^2} dx$$

where x=hw/kBT, q is the Debye temperature, tC is the combined relaxation time due to different scattering mechanisms, and ug is the phonon group velocity. The combined relaxation time is defined as:

$$\frac{1}{\tau_C} = \frac{1}{\tau_U} + \frac{1}{\tau_B} + \frac{1}{\tau_M}$$

where 1/tU, 1/tB, and 1/tM are the phonon relaxation rates which correspond to the three-phonon Umklapp scattering, boundary scattering, and scattering on point defects, respectively. Since each of these relaxation times is also a function of the phonon group velocity, a small variation of the phonon group velocity will lead to a significant change in the lattice thermal conductivity. The 2D superlattice introduces a spatial confinement of the phonon group velocity and thus reduces the phonon wave vector and increases its group velocity. The lattice thermal conductivity decreases with increasing ug. In addition to ug increase, IL also decreases with decreasing tC due to enhanced interface phonon scattering. Therefore, the 2D superlattice leads to the decrease of the lattice thermal conductivity and, thus, to the increase of ZT.

Beyond providing a good figure of merit of silicon germanium superlattice structure, silicon germanium processing has been extensively developed. Therefore, the incorporation of the invention into previously existing technologies is simplified through the selection of silicon germanium as the material for the thermoelectric coolers.

FIGS. 5A–5I illustrate one process for forming silicon germanium thermoelectric cooler structures. The invention is not limited to the process shown, instead this process is merely exemplary and one ordinarily skilled in the art, when reading this disclosure, would understand that many other processes could be used in place of the process illustrated.

Figure 5A:
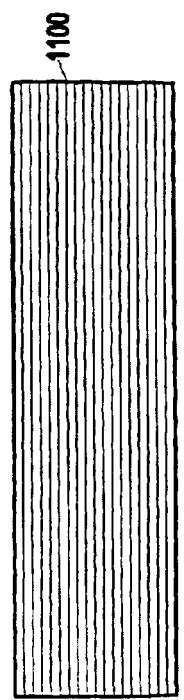
FIGS. 5A–5I are schematic cross-sectional diagrams of different stages in a process to create a microcooler.
Figure 5B:
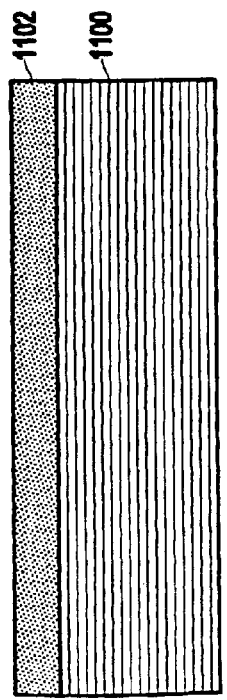

FIG. 5A illustrates a silicon germanium virtual substrate 1100. The silicon germanium virtual substrate could be formed by either molecular beam epitaxy (MBE) or rapid thermal chemical vapor deposition (RTCVD) technique by alternative depositing silicon and germanium layer on SOI substrate. FIG. 5B illustrates a thin strained un-doped epitaxial silicon 1102 grown on top of the substrate 1100 with the thickness below the critical strain relaxation thickness. This thin strained silicon could be again formed by MBE or RTCVD techniques.

Figure 5C:
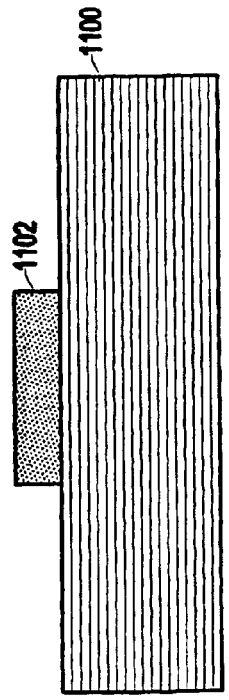

FIG. 5C illustrates the patterning of the silicon layer 1102. The silicon 1102 could be patterned using a number of methods. For example, a mask could be formed over the silicon 1102 and a reactive ion etch (RIE) process could be performed to remove the unprotected portions of the silicon 1102 thereby allowing the silicon mesa island 1102 to remain.

Figure 5D:
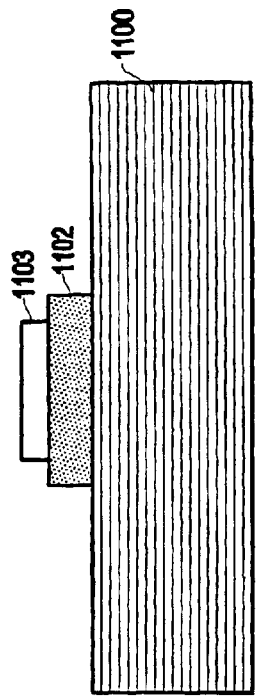
Figure 5E:
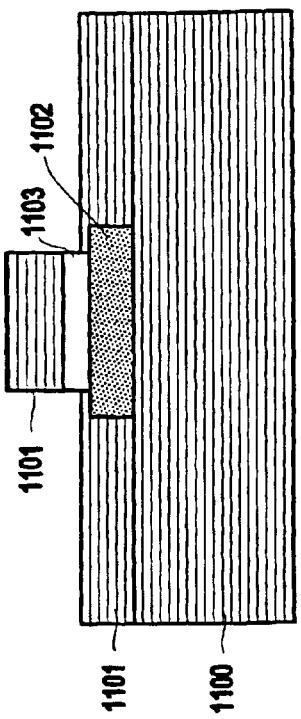

FIG. 5D illustrates a sacrificial material 1103 (e.g., photo resist) that is patterned over the silicon mesa island 1102. FIG. 5E illustrates the growth of a superlattice structure 1101 over all regions of the structure. The growth process is similar to the first SiGe superlattice substrate formation.

Figure 5F:
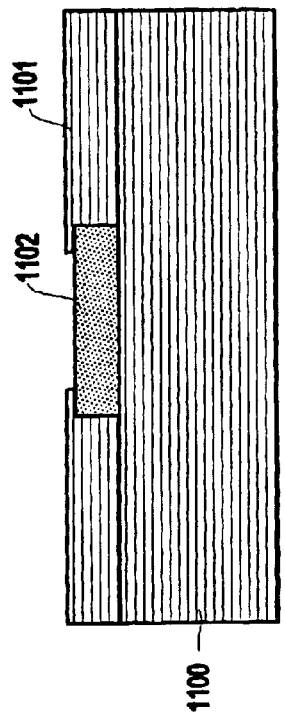

FIG. 5F illustrates the removal of the sacrificial material 1103 that allows the super lattice structure above the mesa island 1102 to be removed, without removing the super lattice structure 1101 from around the sides of the mesa island 1102 by conventional liftoff process. As the sacrificial photoresist is developed and lifted off the chip, the superlattice structure above the mesa island will be lifted off also.

Figure 5G:
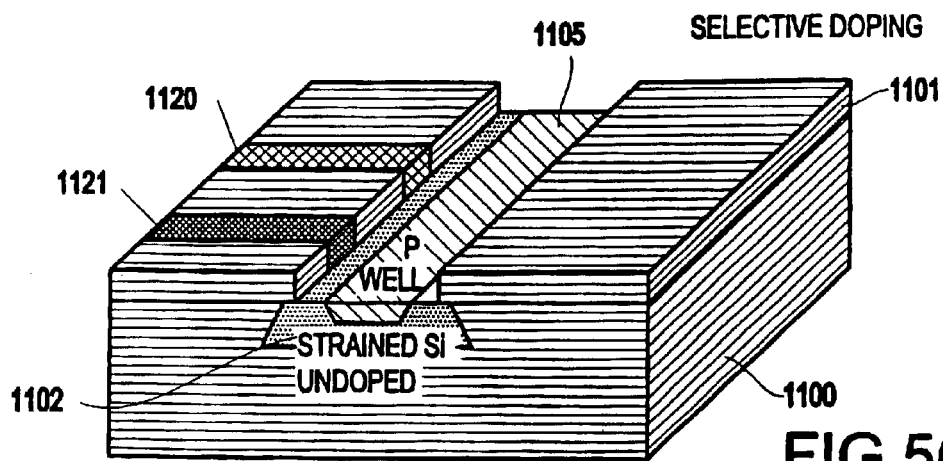

FIG. 5G is a schematic perspective view of the structure after the doping of the P-region 1120, N-region 1121, and P-well 1105 within the mesa island 1102. Many methods could be used to form such dope regions. For example, a mask could be formed to protect areas that are not to receive a doping implant and then and impurity could be implanted into the exposed areas. This mask could then be removed and a different mask could be used to implant a different impurity into different areas. These processes are well known to those ordinarily skilled in the art and not discussed in detail herein.

Figure 5H:
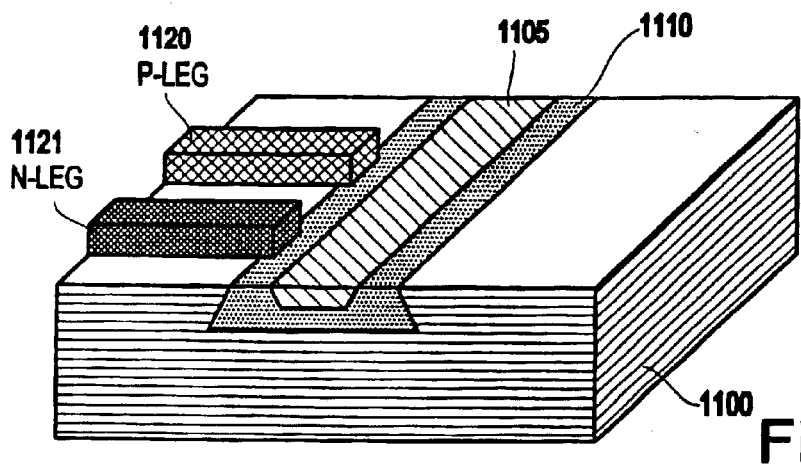
Figure 5I:
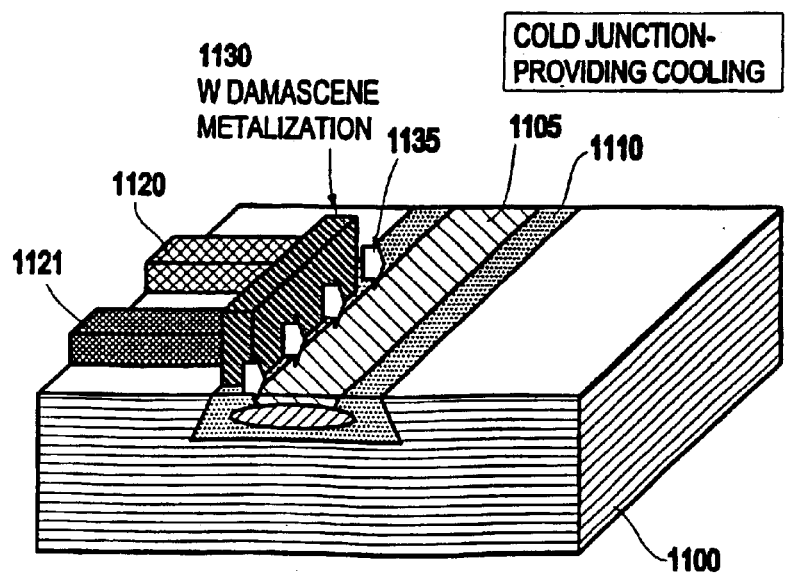

The superlattice structure 1101 is then selectively removed to only allow the P-doped and N-doped super lattice structures 1120, 1121 to remain, and shown in FIG. 5H. A mask could be formed to protect areas that are not to be etched off. Either reactive ion etch or wet chemical etch could be used to etch off un-patterned areas. Next, in FIG. 5I, a metallization region 1130 is formed that allows a cooling effect 1135, as discussed in detail above. The metallization could be formed by conventional "liftoff" processing where a pattern of trenches is formed in a sacrificial material and the metal is deposited in the trenches in a damascene processes (whereafter the sacrificial material is removed). Alternatively, the metal could be blanket deposited and then protected by a patterned mask, whereafter the unprotected regions are removed in an etching process. These and other metallization formation processes are also well known to those ordinarily skilled in the art and not discussed in detail herein.

The improvements seen with the invention are attributed, at least in part, to the confined motion of charge carriers and phonons in the two dimensional (2D) constrained movements instead of three dimensional unconstrained movements. A strong drop of the in-plane lattice thermal conductivity occurs with the inventive structure due to the increased phonon-boundary scattering and spatial phonon confinement associated with only two dimensions. Another benefit from the 2D superlattice structure is the possible increase of density of carrier states. Furthermore, superlattice induced stain in the 2D structure enhances the carrier mobility with even better electronic performance. With the 2D integrated thermoelectric cooler, the device and circuit performance is dramatically increased (e.g., due to the increased phonon-boundary scattering and spatial phonon confinement). This also allows the lifetime and reliability of the inventive device and circuit to be superior. Further, with the waste heat recovery capability of the thermoelectric device, the extra on-chip power could be provided if the power generation function instead of cooling function is utilized, which in-turn reduces the power consumption of the device and circuit.

Through the invention's cooling operation, the device will exist in a cool region having a temperature lower than the surrounding substrate. Indeed, with the invention's operation, the device may even be allowed to operate below the ambient temperature of the surrounding atmosphere. By reducing the operating temperature of the device, the invention allows the device to operate more efficiently, with a longer life expectancy, and with less chance of revealing potential heat-related defects.

While the invention has been described in terms of preferred embodiments, those skilled in the art will recognize that the invention can be practiced with modification within the spirit and scope of the appended claims.

What is claimed is:

1. A method of creating an integrated thermoelectric cooling structure, said method comprising:

forming a strained silicon layer over a substrate;

patterning said strained silicon layer to form a mesa island;

forming a superlattice structure on said substrate adjacent said mesa island;

alternately doping N-type and P-type regions within said superlattice structure;

removing undoped regions of said superlattice structure; and forming a patterned metal conductor to connect N-type and P-type doped regions of said super lattice structure.

2. The method as in claim 1, wherein said process of forming a strained silicon layer comprises epitaxially growing said strained silicon layer.

3. The method as in claim 1, wherein said superlattice structure comprises a silicon germanium superlattice structure.

4. The method as in claim 1, wherein said alternately doping process comprises a series of masking and doping processes that individually create said N-type and P-type regions within said superlattice structure.

5. The method as in claim 1, wherein said substrate comprises an undoped SiGe superlattice structure.

6. The method as in claim 1, further comprising simultaneously forming a heat generating device adjacent N-type and P-type doped regions of said super lattice structure.

* * * * *